United States Patent

[11] 3,593,172

[72] Inventors Berthold Bosch
Ulm;
Wolfgang Heinle, Neu-Ulm; Reinhart Engelmann, Ulm, all of, Germany

[21] Appl. No. 851,898
[22] Filed Aug. 21, 1969
[45] Patented July 13, 1971
[73] Assignee Telefunken Patentverwaltungsgelsellschaft m.b.H.
Ulm am Danube, Germany
[32] Priority Aug. 21, 1968
[33] Austria
[31] 8158/68

[54] SEMICONDUCTOR AMPLIFIER
13 Claims, 6 Drawing Figs.

[52] U.S. Cl. .......... 330/5, 317/234 V, 331/107 G
[51] Int. Cl. .......... H03b 7/06
[50] Field of Search .......... 331/107; 330/5; 317/234

[56] References Cited

OTHER REFERENCES

IEEE TRANSACTIONS ON ELECTRIC DEVICES Vol. Ed. 13 No. 1, Pg. 110— 114, Jan. 1966 Copy Gr 252

*Primary Examiner*—John Kominski
*Attorney*—Spencer & Kaye

ABSTRACT: An amplifier circuit including a Gunn effect semiconductor which exhibits increased limit frequencies and higher negative conductance. The Gunn effect semiconductor is constructed to possess a region in the vicinity of its cathode in which the field strength as effected by a steady state biasing voltage lies between the critical value at which the Gunn oscillation is initiated and a lower value at which the Gunn oscillation is extinguished, while the remainder of the semiconductor body possesses a field strength less than such lower value. The first region is periodically pulse triggered to initiate the Gunn oscillation, the period between pulses being approximately equal to the transit time of a high field zone through the semiconductor body. The triggering pulses may be produced by a second Gunn element or they may be produced in the first Gunn element itself.

Inventors:
Berthold Bosch
Wolfgang Heinle
Reinhart Engelmann
By Spencer & Kaye
Attorneys Inventors:
Berthold Bosch
Wolfgang Heinle
Reinhart Engelmann
By Spencer & Kaye
Attorneys Inventors:
Berthold Bosch
Wolfgang Heinle
Reinhart Engelmann
By Spencer & Kaye
Attorneys Inventors:
Berthold Bosch
Wolfgang Heinle
Reinhart Engelmann
By Spencer & Kaye
Attorneys

SEMICONDUCTOR AMPLIFIER

BACKGROUND OF THE INVENTION

The article in the IEEE Transactions on Electric Devices, Volume ED-13, No. 1, page 110 and entitled "Microwave Amplification in a GaAs Semiconductor" by H. W. Thim and M. R. Barber discloses that it is possible to produce an amplification in a Gunn element having a subcritical $n_0$L product.

SUMMARY OF THE INVENTION

It is an object of the present invention to provide an improved semiconductor amplifier in which the limit frequency for the negative conductance as well as the useful negative conductance are increased and in which the amplifier arrangement may be of a particularly simple construction.

According to the present invention, the semiconductor body is subcritically biased in such a way that the effective field strength in the semiconductor falls between the critical value which determines the initiation of the high field zone producing the oscillation and the lower value which determines its extinction, the initiation of the high field zone being accomplished by a triggering pulse train whose periodicity approximately corresponds to the transit time of the high field zone through the semiconductor body.

DESCRIPTION OF THE PREFERRED EMBODIMENTS

Figure 1:
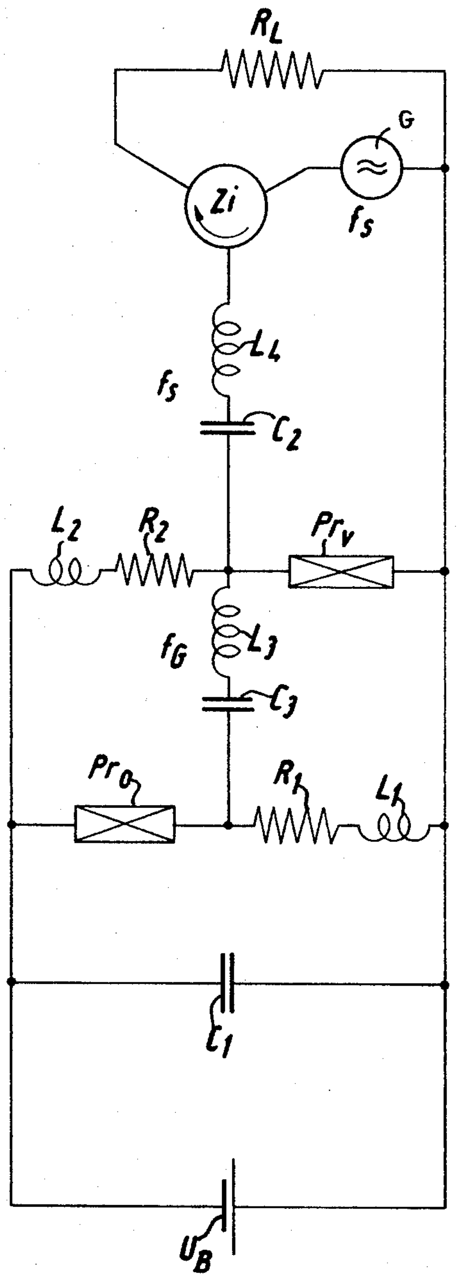
FIG. 1 is an amplifier circuit according to one embodiment of the invention.

With reference to FIG. 1, the Gunn effect semiconductor which is responsible for the amplification is indicated by the reference character $Pr_V$ and a second Gunn effect semiconductor used to trigger the amplifying semiconductor is indicated by the reference character $Pr_O$. Both of these semiconductors may be connected to a common source $U_B$ of biasing voltage, such source being bridged by the capacitor $C_1$. The triggering semiconductor $Pr_0$ is in series, across the biasing source, with a circuit consisting of the resistor $R_1$ and inductance $L_1$. The resistor $R_1$ serves as the DC load and the inductance $L_1$ as a choke for RF frequencies. The semiconductor $Pr_V$ is in series, across the biasing source, with a circuit consisting of a DC load resistor $R_2$ and a choke inductance $L_2$. The semiconductor $Pr_V$ is coupled to the source G of the signal to be amplified, and whose frequency is indicated as $f_s$, by means of the resonant circuit consisting of the inductance $L_4$ and capacitor $C_2$ which are tuned to the signal frequency as indicated. The coupling is effected by means of a circulator $Zi$ and the load resistance $R_L$ is connected as shown. The two Gunn elements are connected by the resonant circuit tuned to the Gunn frequency, such circuit consisting of the inductance $L_3$ and capacitor $C_3$ as shown.

The Gunn element $Pr_0$ serves as an oscillator for the triggering pulses which, by virtue of the resonant circuit $L_3$, $C_3$ coupling the two Gunn elements, so that high field zones are initiated in the semiconductor $Pr_V$. The periodicity of the triggering pulses approximately corresponds to the transit time of the high field zone through the body of the semiconductor $Pr_V$ and, as discussed above, the semiconductor $Pr_V$ is biased by the source $U_B$ subcritically such that the effective field strength in the semiconductor $Pr_V$ falls between the critical value which determines the initiation of the high field zone and the lower value which determines its extinction.

Figure 2:
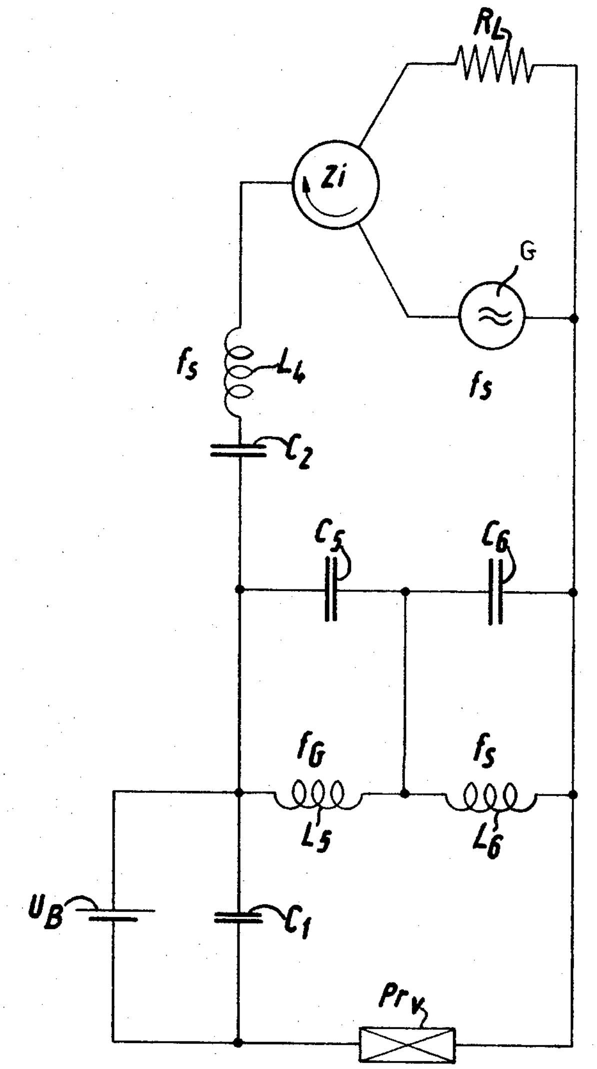
FIG. 2 is an amplifier circuit according to a second embodiment of the invention.

The circuit according to FIG. 2, illustrates the manner in which the triggering pulses are effected in the amplifying semiconductor so that the DC current requirement for the circuit is reduced. As shown, the amplifying Gunn element $Pr_V$ receives its bias from the operating voltage course $U_B$ bridged by the capacitor $C_1$ and, as before, the semiconductor is subcritically biased thereby. The capacitor $C_5$ and inductance $L_5$ comprise a resonant circuit tuned to the Gunn frequency $f_G$ which is connected to a further parallel circuit tuned to the signal frequency $f_s$ and which consists of the inductance $L_6$ and capacitance $C_6$ so that the Gunn element, the bias source and the parallel resonant circuits are connected in series as shown. The signal to be amplified is fed into the circuit again through a circulator $Zi$, a series resonant circuit consisting of capacitance $C_2$ and inductance $L_4$ being connected therebetween. This series resonance circuit is connected at its one end with one arm of the circulator $Zi$ and at its other end leads to the parallel resonant circuit tuned to the Gunn frequency.

Due to the load resistance being capable of resonance the field within the semiconductor body is controlled during each period of the alternating voltage to exceed the critical field strength $E_K$ required to initiate the Gunn oscillations. This is possible in that the Gunn element is disposed on a resonator tuned to the Gunn frequency, the resonator being of such quality that the positive half waves of the generated Gunn oscillations push the semiconductor body into the supercritical field range during each such positive half wave.

Figure 3:
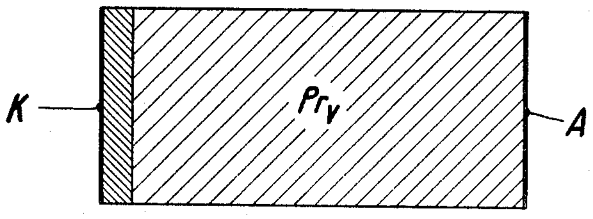
FIG. 3 is a sectional view taken through a semiconductor constructed according to the present invention and illustrating one embodiment thereof.

In a particularly advantageous embodiment of the present invention the required self-triggering is accomplished by a special configuration of the semiconductor body, i.e. there is a field strength within the semiconducting body near the cathode contact K as shown in FIG. 3 for example which effects the initiation of a Gunn oscillation, whereas in the remaining portions of the semiconductor body the field strength remains between the critical value $E_K$ required to initiate the Gunn oscillations and the value $E'_K$ required to extinguish the high field zones. These relations, of course, are due to the steady state biasing source.

Figure 4:
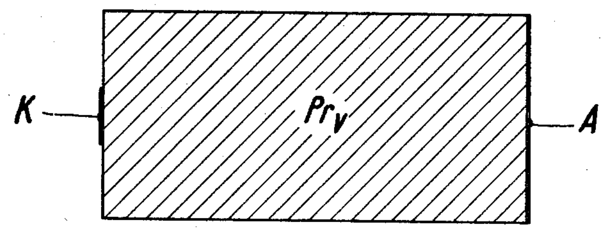
FIG. 4 is a view similar to FIG. 3 but showing a modified form of construction.
Figure 5:
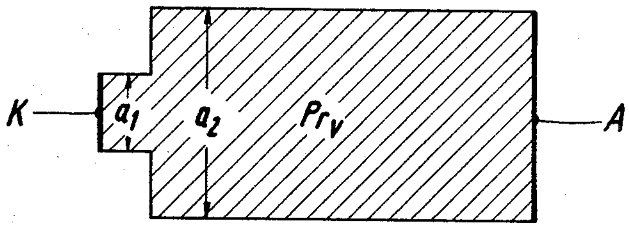
FIG. 5 is a view similar to FIGS. 3 and 4 but showing a further modification of the semiconductor construction.
Figure 6:
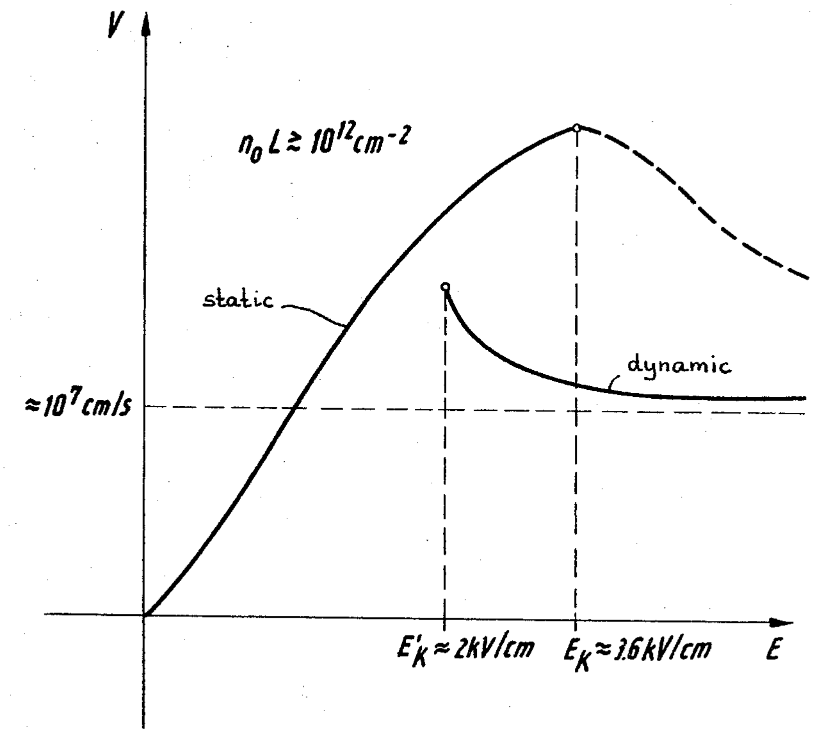
FIG. 6 is a graph illustrating the static and dynamic characteristics of the semiconductor device.

FIG. 6 illustrates the field strengths as described. The drift velocity V is plotted against field strength E. The ascending curve branch reaches the critical value at point $E_K$ whereat a high field zone is initiated within the semiconductor body and, as indicated, this field strength is approximately 3.6 kv./cm. and the ascending curve branch represents the static characteristic of the semiconductor. The other curve branch represents the dynamic characteristic and, in particular, the useful negative conductance. At the field strength marked $E'_K$, the high field zones are extinguished and, as indicated, this value is approximately at 2 kv./cm. The product $n_0$L of electron equilibrium concentration times length of the semiconductor body is $\geq 10^{12}$ cm.$^{-2}$. The above-mentioned self-triggering can now be realized in the following manner. The semiconductor body can be doped in the vicinity of the cathode contact K in such a manner that this area receives less doping than the remaining area of semiconducting body $Pr_V$ toward anode contact A. FIG. 3 is a schematic illustration thereof. It is also possible to produce the required field strength on the cathode side of semiconductor body $Pr_V$ to initiate triggering in that the semiconductor body is provided with the same doping over its entire length and the cathode contact K is selected to be smaller than the cross section of the subsequent portion of the semiconductor body. The anode contact marked A extends, as is shown in FIG. 4, over the entire width of the semiconductor body. The probably most advisable embodiment, however, is that where, according to FIG. 5, the cross section of the semiconductor body is reduced on the side facing the cathode connection K over a relatively short length with respect to the remaining cross section. In FIG. 5, $a_1$ indicates the reduced cross section on the cathode side, whereas the normal cross section of the semiconductor body $Pr_V$ is marked $a_2$. The anode connection is marked A. With the same specific resistance of the semiconductor material in both sections having different cross sections $$E'_K/E_K \text{ must be smaller than } a_1/a_2<1$$

so that the necessary high initiation field strength $E>E_K$ appears at the cathode and the desired low drift field strength $E_D$ in the main portion of the semiconductor body, where $E'_K<E_D<E_K$. In order to prevent double initiation of the high field zones, the following condition should preferably be met $$I_D/I_K<a_1/a_2$$

where $I_D$ is the current density in the travelling high field zone and $I_K$ the current density at the critical field strength. Deviating from the embodiment shown in FIG. 5 in which the transition from the small to the normal cross section of the semiconductor body occurs suddenly, it is also possible to provide this transition in several stages or continuously.

An amplifier constructed according to the present invention can also be so constructed that the Gunn oscillation which effects the negative conductance is utilized for the frequency conversion of the signal oscillation. Depending on whether the frequency conversion which preferably utilizes the semiconductor body itself as its nonlinear element, effects an upward or downward mixing, the mixer arrangement may be constructed either with preamplification or subsequent amplification.

An amplifier constructed according to the present invention produces, after biasing, an increase in the negative conductance which amounts to five to 20 times its value. Moreover, the limit frequency of the triggered amplifier is increased by approximately twice its value.

It will be understood that the above description of the present invention is susceptible to various modifications, changes and adaptations.

We claim:

1. An amplifier in which the negative differential conductance produced during the passage of a high field zone through a Gunn effect semiconductor is utilized for amplification, said amplifier comprising in combination;

a Gunn effect semiconductor;

means for biasing said semiconductor such that the effective field strength within said semiconductor lies between its critical value which determines the initiation of a high field zone and a lower value which extinguishes a high field zone; and means having a pulse train output for periodically triggering said semiconductor above its critical value, the periodicity of which pulse train output is approximately equal to the transit time of a high field zone through said semiconductor.

2. The amplifier according to claim 1 wherein the last-mentioned means comprises a second Gunn effect semiconductor.

3. The amplifier as defined in claim 2 including a separate load circuit for each semiconductor;

a circuit connecting said semiconductors and tuned to their Gunn frequencies;

an oscillating signal source which is to be amplified; and said signal source being connected to the first-mentioned semiconductor through a circulator and a circuit tuned to the signal frequency.

4. The amplifier according to claim 1 wherein the last-mentioned means includes said semiconductor.

5. The amplifier according to claim 4 wherein said last means also includes a resonator tuned to the Gunn frequency and connected to said semiconductor so that the positive pulses of the Gunn oscillations extend said semiconductor above its critical value.

6. The amplifier according to claim 5 including an oscillating signal source;

a first circuit tuned to the Gunn frequency and a second circuit tuned to said signal frequency, said first and second circuits being connected to said semiconductor; and means for selectively connecting said signal source to said first and second circuits.

7. The amplifier according to claim 4 wherein said semiconductor is of reduced cross section in the vicinity of its cathode whereby said means for biasing produces a field strength in the vicinity of said cathode which is above said critical value while the field strength in the remaining portion of said semiconductor lies between said critical and lower values; with:

$$I_D/I_K<a_1/a_2$$

where $a_1$ = cross-sectional area in the vicinity of said cathode $a_2$ = normal cross-sectional area of said semiconductor $I_D$ = current density in the traveling high field zone $I_K$ = current density at the critical field strength.

8. The amplifier according to claim 7 wherein said semiconductor is of reduced doping in the vicinity of said cathode.

9. The amplifier according to claim 7 wherein said cathode contacts said semiconductor over an area smaller than the cross-sectional area of the semiconductor in the vicinity of said cathode.

10. The amplifier according to claim 7 wherein said semiconductor is of reduced cross-sectional area in the vicinity of said cathode.

11. Amplifier as defined in claim 10 wherein the transition from the smaller to the normal cross section of the semiconductor body occurs in one jump.

12. The amplifier according to claim 1 including an oscillating signal source, said semiconductor being connected thereto for frequency conversion of said oscillating signal.

13. In a circuit for amplifying an oscillatory signal, the combination comprising;

a Gunn effect semiconductor having a body provided with an anode at one end and a cathode at its other end, and including means for producing regions having field strengths of different values in said body between said anode and said cathode in response to a predetermined steady state biasing voltage applied across said anode and said cathode, the region having a field strength of higher value being in the vicinity of said cathode and its field strength as effected by said predetermined steady state biasing voltage lying between the critical value of said semiconductor required to initiate the Gunn oscillation and that lower value required to extinguish the Gunn oscillation, the other region having a field strength as effected by said steady state biasing voltage which is less than said lower value required to extinguish the Gunn oscillation;

means for applying said predetermined steady state biasing voltage to said semiconductor body; and means for periodically increasing the field strength in said region in the vicinity of said cathode to a value higher than said critical value whereby to initiate the Gunn oscillation, the periodicity of such periodic increase being approximately equal to the transit time of a high field zone through said semiconductor body.

UNITED STATES PATENT OFFICE
CERTIFICATE OF CORRECTION

Patent No. 3,593,172 Dated July 13th, 1971

Inventor(s) Berthold Bosch, Wolfgang Heinle, Reinhart Engelmann

It is certified that error appears in the above-identified patent and that said Letters Patent are hereby corrected as shown below:

In the heading of the patent, line 8, change "Patentverwaltungsgelsellschaft" to --Patentverwaltungsgesellschaft--; line 10, change "Ulm am Danube" to --Ulm/Donau--. Column 1, line 55, change "R," to --$R_1$--. Column 2, line 8, change "course" to --source--.

Signed and sealed this 14th day of March 1972.

(SEAL)
Attest:

EDWARD M.FLETCHER,JR.
Attesting Officer

ROBERT GOTTSCHALK
Commissioner of Patents

FORM PO-1050 (10-69)

USCOMM-DC 60376-P69
☆ U.S. GOVERNMENT PRINTING OFFICE : 1969 O—366-334